United States Patent
Wang

(10) Patent No.: US 10,399,452 B2
(45) Date of Patent: Sep. 3, 2019

(54) BATTERY CHARGE MANAGEMENT SYSTEM

(71) Applicant: FORD GLOBAL TECHNOLOGIES, LLC, Dearborn, MI (US)

(72) Inventor: Xu Wang, Northville, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 31 days.

(21) Appl. No.: 15/645,896

(22) Filed: Jul. 10, 2017

(65) Prior Publication Data
US 2019/0009686 A1 Jan. 10, 2019

(51) Int. Cl.
- *H02J 7/00* (2006.01)
- *B60L 11/18* (2006.01)
- *G01R 31/36* (2019.01)
- *B60L 58/12* (2019.01)

(52) U.S. Cl.
CPC ........... *B60L 11/1861* (2013.01); *B60L 58/12* (2019.02); *G01R 31/3648* (2013.01)

(58) Field of Classification Search
CPC ... B60L 11/1861; B60L 58/12; G01R 31/3648
See application file for complete search history.

(56) References Cited

U.S. PATENT DOCUMENTS

| | | | |
|---|---|---|---|
| 6,285,163 B1 | 9/2001 | Watanabe et al. | |
| 6,359,419 B1 | 3/2002 | Verbrugge et al. | |
| 7,768,233 B2 | 8/2010 | Lin et al. | |
| 8,004,243 B2 | 8/2011 | Paryani et al. | |
| 8,645,088 B2 | 2/2014 | Schaefer et al. | |
| 2014/0225541 A1* | 8/2014 | Omata | H02P 27/04 318/400.09 |
| 2015/0077063 A1* | 3/2015 | Tsukamoto | H02S 50/00 320/134 |

* cited by examiner

*Primary Examiner* — Vuthe Siek
(74) *Attorney, Agent, or Firm* — David B. Kelley; Brooks Kushman P.C.

(57) ABSTRACT

A hybrid electric vehicle having one or more controllers, voltage-current sensors, and batteries, which are configured to generate and respond to power signals that communicate vehicle operating and start-up conditions, among other parameters and data. The components also are enabled to detect vehicle and battery conditions that include an open circuit voltage (OCV), current, differentiated current (DFC), and near zero current (NZC). The controller(s) are further configured to generate a predicted battery state of charge (SoC) from a combination of the OCV, current, DFC, NZC, and other parameters, which are calibrated according to respective magnitudes and noise calibration factors, which enables the controller(s) to charge and discharge the battery according to the predicted SoC. The controller(s) also may compare the OCV to a predetermined battery performance array that correlates the OCV magnitude with one or more of a battery SoC, cell voltage and internal resistance, temperature, and cumulative charge-discharge cycles.

22 Claims, 2 Drawing Sheets

BATTERY CHARGE MANAGEMENT SYSTEM

TECHNICAL FIELD

The present disclosure relates generally to systems and methods for control and estimation of battery state of charge in a vehicle.

BACKGROUND

Electric, plug-in, battery, and hybrid electric vehicles (HEVs) have a powertrain that includes, among other components, an internal combustion engine, an electric machine or motor/generator, and a battery that are coupled with one or more controllers, current and voltage sensors, and switching components that couple and decouple the battery from other vehicle components. Such components are configured to estimate a state of charge (SoC) of the battery using various current integration techniques that may be undesirably affected by noise in current signals having zero or near zero magnitudes. HEVs may benefit from more accurate SoC estimation capabilities, which may further improve battery lifespan, durability, and performance, and which may in turn enable improved SoC monitoring, adjustment, and control of battery.

SUMMARY

A vehicle and methods of operation according to the present disclosure include various components and systems that also include a powertrain having a battery or other power storage device that is coupled to at least one controller, voltage and current sensors, and switching components that enable connection and disconnection of the battery from other vehicle components. Plug-in, battery, and hybrid electric vehicles (HEVs) include high voltage electric traction batteries that are controlled and managed by controllers that may include a battery energy control module (BECM). The BECM is configured to manage the charging and discharging of the batteries, and to monitor, estimate, and communicate the SoC capacity of the battery(ies).

Two primary methods are often utilized to estimate the SoC for an HEV high-voltage battery, which often incorporates a lithium-ion chemistry. One method includes an ampere-hour integration of charge and discharge currents, which uses a sensor to detect battery currents. However, under low or near zero current or during zero current conditions, the current integration method may be subject to signal noise that introduces less accurate results.

Another method includes a battery open circuit voltage (OCV) method, which utilizes a no-load voltage of the batteries, and which can be especially useful for HEV, lithium-ion battery applications. In a variation, the OCV method may also, during certain conditions such as during constant current (I) 245, utilize a terminal voltage of the battery(ies) that is combined with a detected current and internal resistance of the battery(ies), to determine the OCV. The OCV method may not be preferred and may not be as accurate when the battery(ies) are charging or discharging under load conditions. During certain vehicle operating conditions when battery current is constant or near constant, and/or at zero and is near zero, the subject matter of the present disclosure minimizes and/or prevents accumulated inaccuracies in SoC estimation due to current integration that is affected by low current noise, may be minimized and/or prevented.

In one configuration of the disclosure, a vehicle or HEV includes at least one controller that is coupled to a battery, among other components. The controller(s) is/are configured to respond to a power signal that may indicate an operating condition of the vehicle, and may detect one or more various vehicle parameters and conditions, which may include an OCV, current, differentiated current (DFC), and near zero current (NZC). The controller(s) are also configured to generate a predicted SoC from a combination of such parameters and conditions, such as the OCV, current, DFC, and NZC.

Such parameters are calibrated according to respective magnitudes thereof and according to one or more predetermined or calculated noise calibration factors (NCFs) selected to adjust and calibrate the parameters according to instantaneous vehicle operating conditions. The HEV or vehicle and controller(s) is/are further configured to charge and discharge the battery according to the predicted SoC. This arrangement also contemplates the controller(s) further configured to compare the OCV to a predetermined battery performance array that correlates the OCV magnitude with one or more of a battery SoC, cell voltage, cell internal resistance, temperature, and cumulative charge-discharge cycles. Such controller(s) can then predict the SoC from the combination including the calibrated OCV, which is determined according to the correlated performance array, and which can thereby exclude noise by the calibration factors.

In variations, the disclosure also includes the controller further configured to generate the predicted SoC from a combination that includes the sum of an initial SoC and an integrated current per time calibrated according to the NCFs. The vehicle also may incorporate various switching components configured to open and close battery circuit contacts, to connect and disconnect the battery and other vehicle components. Such components may include for purposes of example, a switching contactor, voltage and current sensors, and combined voltage-current sensors that are coupled to the battery and configured to detect and communicate the OCV when the power signal is generated and encoded by the controller(s) and/or sensor(s) and establishes a specific vehicle operating condition, such as at least one of: (a) a start-up condition when the switching contactor is open and disconnected, (b) a constant non-zero current condition, and/or (c) a constant zero current In other arrangements, the disclosure contemplates the controller(s) being configured to generate SoCs for various vehicle and battery conditions, which include for example a SoC for the OCV and an SoC for current per time (CT). Each SoC may be calibrated such that the OCV-SoC is calibrated with an OCV-factor, and the CT-SoC is calibrated with a CT-factor. Each of the calibration factors may be selected from the NCFs, and in combination sum to 100 percent. Further, the calibration factors are adjusted according to the magnitudes of the detected current, DFC, and NZC. Additionally, the controller(s) generate the predicted SoC from the combined and calibrated OCV-SoC and CT-SoC.

The disclosure includes other adaptations wherein the controller(s) are configured to generate the OCV-factor to be 100% and the CT-factor to be zero, during a vehicle condition when the power signal identifies a startup condition, constant non-zero current, and/or a constant zero current condition, such that the predicted SoC for the battery is established by the calibrated OCV, without being affected by noise from a current time integration of a near zero or zero current. During other vehicle conditions when the power signal identifies a non-startup, vehicle operating condition, the controller(s) are configured to generate the OCV-factor and the CT-factor to each be less than 100% and non-zero, and such that the sum of the OCV and CT factors is 100%. Further, the predicted SoC for the battery is generated by the controller(s) and established by the sum of the calibrated OCV-SoC and CT-SoC.

In a modified arrangement, the controllers adjust the OCV-factor and the CT-factor by comparing a previous predicted SoC, to a new SoC established during a start-up condition, a constant non-zero current condition, and/or a constant zero current condition. The new SoC is determined from a predetermined battery performance array that correlates a new, corresponding OCV with one or more of a battery SoC, cell voltage, cell internal resistance, temperature, and cumulative charge-discharge cycles of the predetermined battery performance array.

The disclosure contemplates methods of controlling the vehicle and adjusting the SoC of the battery according to the predicted SoC in response to the power signal. The method includes detecting by the controller(s) the OCV, current, DFC, and NZC, and generating, also by the controller(s), the predicted SoC from the OCV, DFC, and NZC which are calibrated according to respective magnitudes and with the NCFs. The method also enables comparing the OCV to the predetermined battery performance array and correlating the OCV magnitude with one or more of a battery SoC, cell voltage, cell internal resistance, temperature, and cumulative charge-discharge cycles. As with other arrangements, the method predicts the SoC from the combination to include the calibrated OCV determined according to the correlated performance array, and to attenuate and/or exclude noise by the calibration factors.

The method further may include generating by the controller(s) the SoCs for the OCV and the CT, and to calibrate the OCV-SoC with the OCV-factor and the CT-SoC with the CT-factor. The factors here too are selected from the NCFs, in combination sum to 100 percent, and are adjusted according to the magnitudes of the current, DFC, and NZC, such that the predicted SoC is generated by the controller(s) from the combined and calibrated OCV-SoC and CT-SoC.

Variations of the method of vehicle control also may include generating by the controller the OCV-factor to be 100% and the CT-factor to be zero, when the power signal identifies at least one of: (a) the vehicle startup condition, (b) the constant non-zero current condition, and/or (c) the constant zero current condition, such that the predicted SoC for the battery is established by the calibrated OCV. As in previously described configurations, the method includes generating by the controller the OCV-factor and the CT-factor to each be less than 100% and non-zero, when the power signal identifies a non-startup, vehicle operating condition, such that the predicted SoC for the battery is established by the sum of the calibrated OCV-SoC and CT-SoC. The method further contemplates adjusting by the controller, the OCV-factor and the CT-factor by comparing a previous predicted SoC to a SoC established during a start-up condition, a constant non-zero current condition, and/or a constant zero current condition, from a new SoC determined from a predetermined battery performance array that correlates a new OCV with one or more of a battery SoC, cell voltage, cell internal resistance, temperature, and cumulative charge-discharge cycles.

This summary of the implementations and configurations of these vehicles and methods of operation describe in less technically detailed variations, several exemplary arrangements for the embodiments of this disclosure, and such are further described in more detail below in the detailed description in connection with the accompanying illustrations and drawings, and the claims that follow.

This summary is not intended to identify key features or essential features of the claimed technology, nor is it intended to be used as an aid in determining the scope of the claimed subject matter. The features, functions, capabilities, and advantages discussed here may be achieved independently in various example implementations or may be combined in yet other example configurations, as is further described elsewhere herein, and which may also be understood by those skilled and knowledgeable in the relevant fields of technology, with reference to the following description and drawings.

BRIEF DESCRIPTION OF THE DRAWINGS

A more complete understanding of example implementations of the present disclosure may be derived by referring to the detailed description and claims when considered with the following figures, wherein like and similar reference numbers refer to similar, related, and/or identical elements throughout the figures. The figures and annotations thereon are provided to facilitate understanding of the disclosure without limiting the breadth, scope, scale, or applicability of the disclosure. The drawings are not necessarily made to scale and may be schematic diagrams intended to describe the disclosure to those knowledgeable in the relevant fields of technology.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

As those of ordinary skill in the art should understand, various features, components, and processes illustrated and described with reference to any one of the figures may be combined with features, components, and processes illustrated in one or more other figures to produce embodiments that should be apparent to and within the knowledge of those skilled in the art, but which may not be explicitly illustrated or described. The combinations of features illustrated here are representative embodiments for many typical applications. Various combinations and modifications of the features consistent with the teachings of this disclosure, however, could be desired for particular applications or implementations, and should be readily within the knowledge, skill, and ability of those working in the relevant fields of technology.

Figure 1:
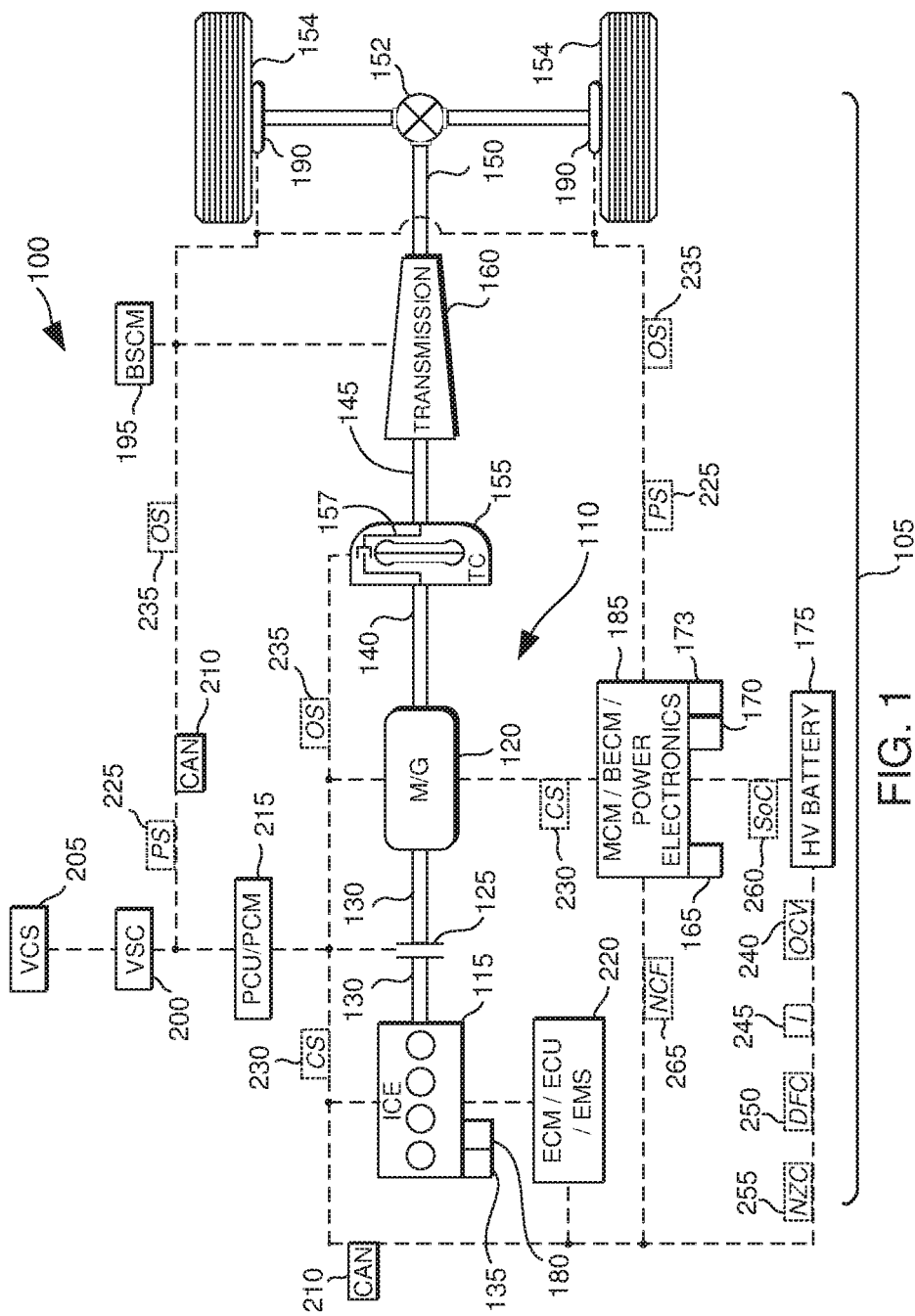
FIG. 1 is an illustration of a hybrid electric vehicle and its systems, components, sensors, and methods of operation.
Figure 2:
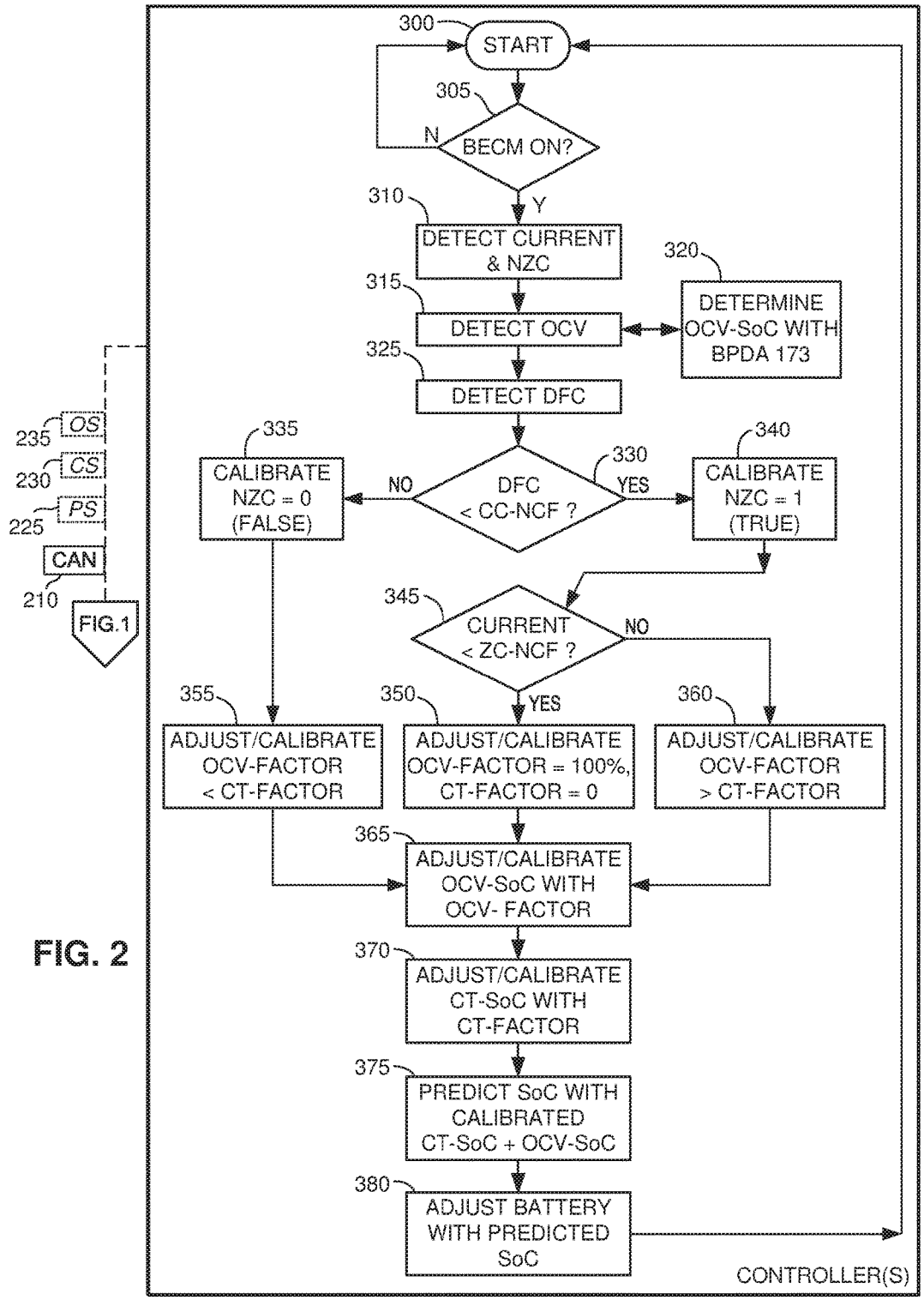
FIG. 2 illustrates additional aspects and capabilities of the vehicle and systems and methods of FIG. 1, with certain components and features added, removed, modified, and rearranged.

With reference now to the various figures and illustrations and to FIGS. 1 and 2, and specifically to FIG. 1, a schematic diagram of an electric, battery, plug-in, and/or HEV 100 is shown, and illustrates representative relationships among components of HEV 100. Physical placement and orientation of the components within vehicle 100 may vary. Vehicle 100 includes a driveline 105 that has a powertrain 110, which includes one or more of an internal combustion engine (ICE) 115 and/or an electric machine or electric motor/generator/starter (M/G) 120, which generate power and torque to propel vehicle 100. Engine 115 is a gasoline, diesel, biofuel, natural gas, or alternative fuel powered engine, or a fuel cell, which generates an output torque in addition to other forms of electrical, vacuum, pressure, and hydraulic power by way of front end engine accessories and accessory devices (FEADs) described elsewhere herein. Engine 115 is coupled to electric machine or M/G 120 with a disconnect clutch 125. Engine 115 generates such power and associated engine output torque for transmission to M/G 120 when disconnect clutch 125 is at least partially engaged.

M/G 120 may be any one of a plurality of types of electric machines, and for example may be a permanent magnet synchronous motor, an electrical power generator, and an engine starter. For example, when disconnect clutch 125 is at least partially engaged, power and torque may be transmitted from engine 115 to M/G 120 to enable operation as an electric generator, and to other components of vehicle 100. Similarly, M/G 120 may operate as a starter for engine 115 with disconnect clutch 125 partially or fully engaged to transmit power and torque via disconnect clutch drive shafts 130 to engine 115 to start engine 115, in vehicles that include or do not include an independent engine starter 135.

Further, M/G 120 may assist engine 115 in a "hybrid electric mode" or an "electric assist mode" by transmitting additional power and torque to turn drive shafts 130 and 140. Also, M/G 120 may operate in an electric only mode wherein engine 115 is decoupled by disconnect clutch 125 and shut down, enabling M/G 120 to transmit positive or negative torque to M/G drive shaft 140. When in generator mode, M/G 120 may also be commanded to produce negative torque and to thereby generate electricity for charging batteries and powering vehicle electrical systems, while engine 115 is generating propulsion power for vehicle 100. M/G 120 also may enable regenerative braking by converting rotational energy from decelerating powertrain 110 and/or wheels 154 into electrical energy for storage, as described in more detail below, in one or more batteries 175, 180.

Disconnect clutch 125 may be disengaged to enable engine 115 to stop or to run independently for powering engine accessories, while M/G 120 generates drive power and torque to propel vehicle 100 via M/G drive shaft 140, torque convertor drive shaft 145, and transmission output drive shaft 150. In other arrangements, both engine 115 and M/G 120 may operate with disconnect clutch 125 fully or partially engaged to cooperatively propel vehicle 100 through drive shafts 130, 140, 150, differential 152, and wheels 154. Differential 152 may transmit approximately equal torque to each wheel 154 and accommodates slight speed differences to enable the vehicle to turn and maneuver. Different types of differentials or similar devices may be used to distribute equal and/or unequal torque from powertrain 110 to wheels 154, for rear-drive, front-drive, and all-wheel drive vehicles. In some vehicles, differential torque distribution may be controlled and varied to enable desired operating modes or conditions wherein each vehicle wheel 154 receives different torque.

Drive shaft 130 of engine 115 and M/G 120 may be a continuous, single, through shaft that is part of and integral with M/G drive shaft 140, or may be a separate, independent drive shaft 130 that may be configured to turn independently of M/G drive shaft 140, for powertrains 110 that include multiple, inline, or otherwise coupled M/G 120 configurations. The schematic of FIG. 1 also contemplates alternative configurations with more than one engine 115 and/or M/G 120, which may be offset from drive shafts 130, 140, and where one or more of engines 115 and M/Gs 120 are positioned in series and/or in parallel elsewhere in driveline 105, such as between or as part of a torque convertor and a transmission, off-axis from the drive shafts, and/or elsewhere and in other arrangements. Still other variations are contemplated without deviating from the scope of the present disclosure.

Driveline 105 and powertrain 110 also include a torque convertor (TC) 155, which couples engine 115 and M/G 120 of powertrain 110 with and/or to a transmission 160. Transmission 160 may be a multiple step-ratio, and/or a multiple and variable torque-multiplier-ratio, automatic and/or manual transmission or gearbox 160 having a plurality of selectable gears. TC 155 may further incorporate a bypass clutch and clutch lock 157 that may also operate as a launch clutch, to enable further control and conditioning of the power and torque transmitted from powertrain 110 to other components of vehicle 100. Transmission 160 may include TC 155 and bypass clutch 157 to be integral with transmission or gearbox 160 in some variations.

Powertrain 110 and/or driveline 105 further include one or more current and voltage sensors 165, switching devices 170 such as contactors, a battery performance data array (BPDA) 173, and batteries 175, 180. Such voltage and current sensors 165 may be independent devices and/or may be combined as a dual function sensor or sensors 165. The switching devices may be any suitable electromechanical and/or solid-state switching device 170, such as a contactor that is switchable between open or disconnected, and closed or connected configurations to connect and disconnect one or more terminals of the battery(ies) 175 from other components of HEV 100.

One or more such batteries can be a higher voltage, direct current battery or batteries 175 operating in ranges between about 48 to 600 volts, and sometimes between about 140 and 300 volts or more or less, which is/are used to store and supply power for M/G 120, and other vehicle components and accessories. Other batteries can be a low voltage, direct current battery(ies) 180 operating in the range of between about 6 and 24 volts or more or less, which is/are used to store and supply power for starter 135 to start engine 115, and for other vehicle components and accessories.

Batteries 175, 180 are respectively coupled to engine 115, M/G 120, and vehicle 100, as depicted in FIG. 1, through various mechanical and electrical interfaces and vehicle controllers, as described elsewhere herein. High voltage M/G battery 175 is also coupled to M/G 120 by one or more of a motor control module (MCM), a battery energy control module (BCM or BECM), and/or power electronics 185, which are configured to condition direct current (DC) power provided by high voltage (HV) battery 175 for M/G 120. MCM/BCM/BECM 185 is also configured to condition, invert, and transform DC battery power into three phase alternating current (AC) as is typically required to power electric machine or M/G 120. MCM/BCM/BECM 185 is also configured to charge one or more batteries 175, 180 with energy generated by M/G 120 and/or FEAD components, and to supply power to other vehicle components as needed.

Vehicle 100 may also incorporate one or more brakes 190 coupled to wheels 154 and brake system control module (BSCM) 195. Brakes 190 and BSCM 195 may be operative to mechanically and/or electrically decelerate wheels 154, and to enable regenerative braking that captures deceleration energy from wheels 154, and in cooperation with MCM/BECM 185, and possibly other controllers, M/G 120, and other components, enables charging of HV battery(ies) 175 and other batteries 180, and other power storage components.

With continued reference to FIG. 1, vehicle 100 further includes one or more controllers and computing modules and systems that enable a variety of vehicle capabilities. For example, vehicle 100 may incorporate a vehicle system controller (VSC) 200 and a vehicle computing system (VCS) and controller 205, which are in communication with MCM/BECM 185, BSCM 195, other controllers, and a vehicle network such as a controller area network (CAN) 210, and a larger vehicle control system and other vehicle networks that include other micro-processor-based controllers as described elsewhere herein. CAN 210 may also include network controllers in addition to communications links between controllers, sensors, actuators, and vehicle systems and components.

While illustrated here for purposes of example, as discrete, individual controllers, MCM/BECM 185, BSCM 195, VSC 200 and VCS 205 may control, be controlled by, communicate signals to and from, and communicate with other controllers, and other sensors, actuators, signals, and components that are part of the larger vehicle and control systems and internal and external networks. The capabilities and configurations described in connection with any specific micro-processor-based controller as contemplated herein may also be embodied in one or more other controllers and distributed across more than one controller such that multiple controllers can individually, collaboratively, in combination, and cooperatively enable any such capability and configuration. Accordingly, recitation of "a controller" or "the controller(s)" is intended to refer to such controllers both in the singular and plural connotations, and individually, collectively, and in various suitable cooperative and distributed combinations.

Further, communications over the network and CAN 210 are intended to include responding to, sharing, transmitting, and receiving of commands, signals, data, control logic, and information between controllers, and sensors, actuators, controls, and vehicle systems and components. The controllers communicate with one or more controller-based input/output (I/O) interfaces that may be implemented as single integrated interfaces enabling communication of raw data and signals, and/or signal conditioning, processing, and/or conversion, short-circuit protection, circuit isolation, and similar capabilities. Alternatively, one or more dedicated hardware or firmware devices, controllers, and systems on a chip (SoCs) may be used to precondition and preprocess particular signals during communications, and before and after such are communicated.

In further illustrations, MCM/BECM 185, BSCM 195, VSC 200, VCS 205, CAN 210, and other controllers, may include one or more microprocessors or central processing units (CPU) in communication with various types of computer readable storage devices or media. Computer readable storage devices or media may include volatile and nonvolatile storage in read-only memory (ROM), random-access memory (RAM), and non-volatile or keep-alive memory (NVRAM or KAM). NVRAM or KAM is a persistent or non-volatile memory that may be used to store various commands, executable control logic and instructions and code, data, constants, and variables needed for operating the vehicle and systems, while the vehicle and systems and the controllers and CPUs are unpowered or powered off. Computer-readable storage devices or media may be implemented using any of a number of known memory devices such as PROMs (programmable read-only memory), EPROMs (electrically PROM), EEPROMs (electrically erasable PROM), flash memory, or any other electric, magnetic, optical, or combination memory devices capable of storing data.

With attention invited again to FIG. 1, vehicle 100 also may include VCS 205 to be the SYNC onboard vehicle computing system manufactured by the Ford Motor Company (See, for example, U.S. Pat. No. 9,080,668). Vehicle 100 also may include a powertrain control unit/module (PCU/PCM) 215 coupled to VSC 200 or another controller, and coupled to CAN 210 and engine 115, M/G 120, and TC 155 to control each powertrain component. A transmission control unit may also be coupled to VSC 200 and other controllers via CAN 210, and is coupled to transmission 160 and also optionally to TC 155, to enable operational control. An engine control module (ECM) or unit (ECU) or energy management system (EMS) 220 may also be included to be in communication with CAN 210, and is coupled to engine 115 and VSC 200 in cooperation with PCU 215 and other controllers.

In this arrangement, VSC 200 and VCS 205 cooperatively manage and control the vehicle components and other controllers, sensors, and actuators. For example, the controllers may communicate control commands, logic, and instructions and code, data, information, and signals to and/or from engine 115, disconnect clutch 125, M/G 120, TC 155, transmission 160, batteries 175, 180, MCM 185, and BSCM 195, and other components and systems. The controllers also may control and communicate with other vehicle components known to those skilled in the art, even though not shown in the figures. The embodiments of vehicle 100 in FIG. 1 also depict exemplary sensors and actuators in communication with vehicle network and CAN 210 that can transmit and receive signals to and from VSC 200, VCS 205, and other controllers.

For further example, various other vehicle functions, actuators, and components may be controlled by the controllers within the vehicle systems and components, and may receive signals from other controllers, sensors, and actuators, which may include, for purposes of illustration but not limitation, an alternator or generator, M/G 120, high and low voltage batteries 175, 180, and various sensors for regenerative braking, battery charging or discharging, including sensors 165 for determining the maximum charge, state of charge, and discharge power limits, charge power limit, temperature, voltage, current, and other components.

As depicted in the various figures, including FIGS. 1 and 2, and others, such control logic and executable instructions and signals, and data can also include vehicle power signals (PS) 225, control or command signals (CS) 230 received from and sent to vehicle controllers, components, and systems, and other signals (OS) 235. Such signals and commands may be generated by and communicated from any of the vehicle controllers, sensors, actuators, components, and systems signals. Other such controller(s), sensor(s), actuator(s), and components may also receive and be responsive to such signals. Any or all of these signals can be raw analog or digital signals or preconditioned, preprocessed, combination, and/or derivative signals generated in response to other signals, and embedding information therein. PSs 225, CSs 230, and OSs 235 may be generated and/or encoded by the controller(s) and/or sensors and may include a variety of specific signals, including for purposes of illustration without limitation, currents, voltages, differentiated current over time, integrated current over time, battery charge state, and various limit signals, as well as digital data and information embedded in such signals, and as described in more detail elsewhere herein.

The communication and operation of the described signals and commands 225, 230, 235, control instructions and logic, and data and information by the various contemplated controllers, sensors, actuators, and other vehicle components, may be represented schematically as shown in FIG. 1, and by flow charts or similar diagrams as exemplified in FIG. 2, and elsewhere herein. Such flow charts and diagrams illustrate exemplary commands and control processes, control logic and instructions, and operation strategies, which may be implemented using one or more computing, communication, and processing techniques that can include real-time, event-driven, interrupt-driven, multi-tasking, multi-threading, and combinations thereof. The steps and functions shown may be executed, communicated, and performed in the sequence depicted, and in parallel, in repetition, in modified sequences, and in some cases, may be combined with other processes and omitted. The commands, control logic, and instructions may be executed in one or more of the described microprocessor-based controllers and may be embodied as primarily hardware, software, virtualized hardware, firmware, virtualized firmware, and combinations thereof.

During operation of vehicle 100, and with continued reference to FIGS. 1 and 2, HEV 100 incorporates controller(s) such as any of those described elsewhere herein that is coupled to battery(ies) 175. The controller(s) is/are configured to respond to PS 225, and/or CS 230 and OS 235, and to detect various vehicle parameters and conditions, such as an open circuit voltage (OCV) 240, current (I) 245, differentiated current (DFC) 250, and near zero current (NZC) 255. Utilizing these parameters and conditions, the controller(s) also generate a predicted state of charge (SoC) 260 from a combination of the detected OCV 240, current 245, DFC 250, and NZC 255 that are calibrated according to respective magnitudes, and with noise calibration factors (NCFs) 265. With the predicted SoC 260, the controller(s) then adjust, charge, and discharge the battery(ies) 175.

More specifically, such controller(s) detect a new OCV 240 of the battery 175 with one or more of the voltage sensors 165, typically when the switching devices, such as contactors 170 are open and disconnect the battery(ies) 175 from other components of HEV 100. In an HEV 100 that incorporates HV battery(ies) 175 that employ lithium-ion chemistries, OCV 240 has been found to be predictive of the respective actual and/or predicted SoC 260. In adaptations of this capability, the controller(s) may further also detect in certain conditions and circumstances, such as during constant zero current (I) 245, a new OCV 240 with the sensors detecting the terminal voltage of the battery(ies) 175 in combination with the current (I) 245 and the internal resistance of the battery(ies) 175.

With the newly detected OCV 240, the controller(s) can further utilize the battery performance data array (BPDA) 173 to predict a new SoC 260 by comparing a newly detected OCV 240 to one or more data elements and parameters contained in BPDA 173, which may include, for purposes of example without limitation, previously predicted and/or historical SoCs 260, historical and/or predetermined OCVs that correspond generally and/or linearly to expected, known, or experimentally determined battery and cell states of charge (SoCs), internal cell resistances, cell voltages, temperatures, cumulative charge-discharge cycles, and other performance parameters and data elements associated with a particular battery or batteries 175. It has been observed that OCV 240 is a preferable indicator of predicted SoC 260 of battery(ies) 175 when not connected, OCV 240 may enable an accurate prediction of SoC 260 during one or more of: (a) a start-up condition of HEV 100, (b) the constant non-zero current condition, and/or (c) the constant zero current condition, before battery(ies) 175 are subjected to an operational load condition, and possibly also after battery(ies) 175 have sufficiently relaxed and stabilized thermally and electrochemically from prior charging and discharging.

The detected current (I) 245 and the NZC 255 are also detected by the controllers utilizing the current and/or combined voltage-current sensors 165. During nominal operation of HEV 100, such currents I 245 and NZC 255 are typically detected and utilized as an additional method of estimating predicted SoC 260 over time since the instantaneous and/or predicted SoC 260 of battery(ies) 175 is adjusted as a function of an initial SoC 260 plus the integral of and/or integrated current with respect to time, during charging and discharging. During coast, creep, and slow speeds of HEV 100 when the detected current (I) 245 is low, such as for example less than or equal to about 0.5 amps or more or less, current (I) sensors 165 can be subject to intrinsic measurement bias or noise that may render a less than desirable accuracy of measured actual current. Consequently, the detected I 245 may require calibration to enable accurate prediction of SoC 260. As may be understood by those skilled in the technology, the initial SoC 260 may be stored by the controller(s) during previous operations, and may also be determined by other methods, including the example of lithium-ion battery(ies) 175 where at least one of: (a) the pre-operation, start-up condition OCV 240, (b) the constant non-zero current condition, and/or (c) the constant zero current condition, is detected and utilized to predict SoC 260 as the initial SoC.

Current (I) 245 is preferably calibrated utilizing adaptively selected and adjusted NCFs 265 that may be fixed at the time of manufacture of HEV 100 and/or adjusted in response to changing performance of HEV 100 during real-time operation or during service and maintenance operations. For example, one such NCF 265 may be employed to determine whether detected current (I) 245 may be subject to measurement bias or noise of sensors 165. Such an NCF 265 may include a bias noise constant current NCF 265 (CC-NCF), which for example may be adjusted and/or calibrated to be approximately 0.3 amps. This NCF 265 can be utilized by the controller(s) to detect that current (I) conditions that may be affected by the intrinsic bias/noise. Similarly, currents (I) 245 may be differentiated with respect to time to generate DFC 250 in real-time, to also detect instances of current (I) 245 that may be close to a constant current, such as a magnitude of DFC 250 being less than the CC-NCF 265 of approximately 0.3 amps/second or more or less. In this example, when calibrated by CC-NCF 265, it may be determined that current (I) 245 is subject to the bias/noise inherent in the sensors 165 and intrinsic to other physical attributes of HEV 100 components that may cause measurement and detection errors. But once calibrated with CC-NCF 265, DFC 250 is adjusted to zero to reflect the constant and/or near constant current (I) 245. In this example, the differential of detected substantially constant current (I) 245 will actually be zero and/or may be near zero, depending upon intrinsic measurement sensor bias/noise. Described in another way, as a consequence of such intrinsic measurement bias or noise, DFC 250 should be zero for constant and/or near constant current (I) 245, but as measured may not be zero, and may instead reflect a changing detected current, which change is due to such bias and noise.

In further examples, another bias noise zero current NCF 265 (ZC-NFC) may be calibrated to be about 0.5 amps, which may be utilized to further compare to and to calibrate a magnitude of detected current (I) 245, to determine if current (I) 245 is near zero and is essentially and/or likely in fact zero (but for intrinsic measurement sensor noise). Additionally, ZC-NFC 265 may be utilized to generate NZC 255 in response to such conditions, which NZC 255 may be a boolean true/false, or zero or one, calibration value that calibrates detected current (I) 245 to be zero, under appropriate conditions, such that these NCFs 265 are utilized to attenuate and/or exclude noise from the predicted SoC 260. The controller(s) are further configured to thereby generate the predicted SoC 260 from the sum of the initial and/or initially-predicted SoC 260 and the integrated current per time that is calibrated according to the NCFs 265.

In additional variations of the disclosure, the switching contactor(s) 170 and voltage-current sensor(s) 165 are coupled to the battery(ies) 175, and are configured to detect and communicate the OCV 240, when the switching contactor is open and when PS 225 is received and signals and/or establishes at least one of: (a) the vehicle start-up condition, (b) the constant non-zero current condition, and/or (c) the constant zero current condition. In further arrangements, the controller(s) is/are configured to generate a predicted SoC 260 component that corresponds to OCV 240 (OCV-SoC), and another SoC 260 component that corresponds to a current (I) 245 per time (CT) (CT-SoC). These SoC components are combined to generate predicted SoC 260. In this arrangement, the controller(s) calibrate the OCV-SoC with an OCV-factor 265 and the CT-SoC with a CT-factor 265, to adjust each SoC component to minimize or eliminate noise and bias when combined to generate predicted SoC 260, and to improve the accuracy of predicted SoC 260.

The OCV-factor and CT-factor may be additional NCFs 265 that are utilized to improve the accuracy of and to calibrate the SoC components that are combined to generate the predicted SoC 260. In one adaptation, OCV-factor and CT-factor may be selected from a group of predetermined NCFs 265 and/or adjusted in response to performance and operating conditions of HEV 100 and PS 225. OCV-factor and CT-factor in combination may also be configured to sum to 100 percent, and are used in either contemplated arrangement to calibrate the respective SoC 260 component to minimize and/eliminate noise and bias from each of the SoC components.

These NCFs 265, OCV-factor and CT-factor, are also predetermined and/or adjusted according to the magnitudes of the current (I) 245, DFC 250, and NZC 255. For example, if DFC 250 does not exceed CC-NCF 265 (establishing a constant current 245), and I 245 does not exceed ZC-NCF 265 (establishing a likely zero actual current 245), then CT-factor may be adjusted to be zero while OCV-factor may be adjusted to be 100%, or 1.0. This variation may be suitable when PS 225 is encoded by the controller(s) and/or otherwise establishes and/or identifies one or more or at least one of: (a) a startup, pre-operation vehicle condition, (b) a constant non-zero current condition, and/or (c) the constant zero current condition. This example enables calibration of predicted SoC 260 to exclude bias and noise from the SoC component determined from low detected current (I) 245, and to utilize instead the SoC component from detected OCV 240, which improves accuracy of predicted SoC 260.

In another example where DFC 250 does not exceed CC-NCF 265 (establishing a calibrated constant current 245), but current (I) 245 exceeds ZC-NCF 265 (establishing that a calibrated non-zero constant current 245 likely may exist, but which current (I) 245 may be affected by measurement bias), then CT-factor may be adjusted to be non-zero and less than OCV-factor, such that for example OCV-factor may be adjusted/re-calibrated to be approximately 75%, or 0.75, while CT-factor may be adjusted/re-calibrated to be approximately 25% or 0.25. This particular modification may be preferred when PS 225 identifies a non-startup, vehicle operating condition, such as when HEV 100 is coasting or moving slowly, such that detected current (I) 245 is close to constant. This variation enables predicted SoC 260 to be calibrated such that the SoC component from detected OCV 240 is amplified while the possibly noisy SoC component predicted from detected current (I) 245 is diminished, which when such SoC components are combined to generate predicted SoC 260, reduces or attenuates possible influence of noise or bias and thereby improves the accuracy of predicted SoC 260.

A further example includes an arrangement where DFC 250 exceeds CC-NCF 265 (establishing a likely non-constant, changing current 245), and current (I) 245 is not tested against ZC-NCF 265 (because current 245 is changing but not zero). Here, CT-factor may be adjusted to be non-zero and greater than OCV-factor. For this continuing example, OCV-factor may be adjusted to also be non-zero and perhaps to be about 10%, or 0.10, while CT-factor may be adjusted to be non-zero and about 90% or 0.90. This variation enables predicted SoC 260 to be calibrated such that the SoC component from a possibly noisy or less accurate detected OCV 240 is diminished, while the likely more accurate SoC component predicted from detected current (I) 245 is amplified. This arrangement may be preferred during nominal vehicle operational conditions, when PS 225 again identifies a non-startup, vehicle operating condition, but where detected current (I) 245 is higher than in other examples. Again, under various and changing operating conditions of HEV 100, the possible influence of noise or bias may be lessened or attenuated during generation of predicted SoC 260 from the combined components, which also improves the accuracy of predicted SoC 260.

The disclosure also contemplates additional methods of operation, which may be understood by those knowledgeable in the relevant fields of technology with continuing reference to the various figures, including specifically FIG. 2. During operation, one or more of the controller(s) described elsewhere herein, such for example without limitation, BECM 185, are incorporated in HEV 100 and configured to respond to PS 225 at step 300.

The PS 225 may include, among other elements already described, signals, data, and commands to detect various HEV 100 performance characteristics, parameters, and conditions, including for example the vehicle start-up, pre-operation, constant non-zero current, constant zero current, and non-startup operating conditions, among others. At step 305, the controller(s) may further detect a powered-on condition for BECM 185, either concurrent with receiving and/or detecting PS 225, and/or as part of detecting/receiving PS 225. In response to PS 225, at step 310 the controller(s) detect current (I) 245, and/or near zero current (NZC) 255 is also detected as explained elsewhere herein. Further at step 315, the controller(s) is/are configured to detect OCV 240, and at step 320 to determine and/or predict SoC 260 or OCV-SoC component 260 by utilizing BPDA 173.

One or more of the controller(s) also at step 325 detect and/or generate DFC 250. With these parameters and vehicle conditions, the controllers in any of these steps, and also perhaps next at step 330, receive and/or calibrate CC-NCF 265, and initially test for the constant current 245 condition. More specifically, also at step 330, the controller(s) test(s) whether the magnitude of DFC 250 is lower than CC-NCF 265, which if so establishes that a constant current 245 exists such that it should be also determined whether such constant current is at or near zero. As already described, if DFC 250 exceeds CC-NCF 265 as calibrated (establishing the constant current 245), then control proceeds to step 335 and NZC 255 may be calibrated, for example to be zero or false, which indicates that a constant current condition does not exist.

In contrast, if DFC 250 is lower than CC-NCF 265 (a constant current 245 is established), then NZC 255 may be calibrated differently at step 340, for example to be non-zero or one or true, or another appropriate calibration value. If the constant current condition is established and NZC 255 is true or non-zero, then the controller(s) may also be configured to test whether a near zero and/or zero current condition exists at step 345, such that a magnitude of detected current (I) 245 is compared to the calibrated ZC-NCF 265. If the magnitude of detected I 245 does not exceed ZC-NCF 265, then a zero current condition is established and control passes to step 350 where the controller(s) are configured to reduce or eliminate noise or bias in detected current (I) 245, and are further configured to calibrate OCV-factor 265 to be maximized, such as 100% or 1.0 as explained previously, while CT-factor 265 is calibrated to be minimized, such as zero.

If the controller(s) at step 330 did not detect a condition of a constant current (I) 245, and NZC 255 is calibrated at step 335 to be zero, then control may pass to step 355, such that the controller(s) are configured to adjust/calibrate OCV-factor 265 and CT-factor 265 to be non-zero, and more preferably to calibrate OCV-factor 265 to be less than CT-factor 265 such that noise and/or bias from the OCV-SoC 260 component is minimized while the CT-SoC 260 component is amplified in predicting SoC 260. In another contrasting example, if at step 345 a non-zero current condition is detected, then the controller(s) are configured at step 360 to adjust/calibrate OCV-factor 265 and CT-factor 265 to again be non-zero, and more preferably to calibrate OCV-factor 265 to be greater than CT-factor 265 such that noise and/or bias from the CT-SoC 260 component is minimized while the OCV-SoC 260 component is amplified in predicting SoC 260. In both of these examples, noise and/or bias in measured and detected OCV 240 and current (I) 245 is reduced and/or eliminated, which enables improved accuracy in predicted SoC 260.

In each of these examples, the controller(s) are additionally configured at step 365 and step 370 to utilize the calibrated OCV-factor 265 and CT-factor 265 to further respectively calibrate and adjust OCV-SoC 260 and CT-SoC 260. At step 375, the controller(s) is/are calibrated to then combine the calibrated component OCV-SoC and CT-SoC to generate predicted SoC 260. At step 380, the controller(s) then are configured to adjust the charging and discharging of battery(ies) 175 according to the predicted SoC 260, and to continue the method of operation in response to further PSs 225.

The descriptions herein refer to systems, methods, components, elements, nodes, or features being in "communication" and or "coupled" together. As used herein, unless expressly stated otherwise, use of these terms and words are intended and must be understood to mean that one system/method/sensor/actuator/component/element/module/feature is directly or indirectly coupled, joined to, and/or communicates with another, either electronically, mechanically, or both and in some similar way that enables cooperative operation and exchange and interchange of data and information.

Further, even though the various described implementations, figures, illustrations, and drawings depict representative examples and arrangements of components, elements, devices, and features, many different additional variations, arrangements, modifications, and intervening components, elements, devices, and features, may also be present in further exemplary implementations that are contemplated by the present disclosure.

Terms, words, and phrases used in this document, and variations thereof, unless otherwise expressly stated, must be construed as open ended as opposed to limiting. For example, the term "including" should be understood to mean "including, without limitation" or similar meanings; the term "example" is used to loosely describe illustrative instances of the item being described, but is not an exhaustive, exclusive, or limiting list; and adjectives such as "conventional," "traditional," "normal," "standard," "known", and terms with similar meanings must not be construed to limit the description to a given example, or to an exemplary item commercially available in the market as of a specific date and time period.

Instead, these descriptions are intended to be understood to include conventional, traditional, normal, or standard technologies that may be available now and at any time in the future in some improved and modified form according to the innovations described in this disclosure. Similarly, a group of words described and joined with the conjunction "and" or the disjunctive "or" must be understood only as exemplary and representative but not exclusive groups, and not as requiring that only or each and every one of those described items must be or must not be present in the contemplated group. Rather, use of such conjunctives and disjunctives must be understood to mean "and/or" unless expressly stated otherwise.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:
1. A vehicle, comprising:
   a controller coupled to a battery, and configured to, in response to a power signal:
   detect an open circuit voltage (OCV), current, differentiated current (DFC), and near zero current (NZC),
   generate a predicted state of charge (SoC) from a combination of the OCV, current, DFC, and NZC that are calibrated according to respective magnitudes and with noise calibration factors (NCFs), and
   charge and discharge the battery according to the predicted SoC.

2. The vehicle according to claim 1, further comprising:
the controller further configured to:
compare the OCV to a predetermined battery performance array that correlates the OCV magnitude with one or more of a battery SoC, cell voltage, cell internal resistance, temperature, and cumulative charge-discharge cycles; and
predict the SoC from a combination including the calibrated OCV determined according to the correlated performance array, and to exclude noise by the NCFs.

3. The vehicle according to claim 1, further comprising:
the controller further configured to:
generate the predicted SoC from a combination that includes a sum of an initial SoC and an integrated current per time calibrated according to the NCFs.

4. The vehicle according to claim 1, further comprising:
a switching contactor and voltage-current sensor coupled to the battery and configured to detect and communicate the OCV when the power signal establishes at least one of: (a) a vehicle start-up condition and when the switching contactor is open, (b) a constant non-zero current, and (c) a constant zero current.

5. The vehicle according to claim 1, further comprising:
the controller configured to generate:
a SoC for the OCV and an SoC for current per time (CT), and to calibrate the OCV-SoC with an OCV-factor and the CT-SoC with a CT-factor such that the factors: (a) are selected from the NCFs, (b) sum to 100 percent, and (c) are adjusted according to the magnitudes of the current, DFC, and NZC, and
the predicted SoC from a combined and calibrated OCV-SoC and CT-SoC.

6. The vehicle according to claim 5, further comprising:
the controller configured to generate the OCV-factor to be 100% and the CT-factor to be zero when the power signal identifies a vehicle startup condition such that the predicted SoC for the battery is established by the calibrated OCV.

7. The vehicle according to claim 5, further comprising:
the controller configured to generate the OCV-factor and the CT-factor to each be less than 100% and non-zero, when the power signal identifies a non-startup, vehicle operating condition, such that the predicted SoC for the battery is established by the sum of the calibrated OCV-SoC and CT-SoC.

8. The vehicle according to claim 5, further comprising:
the controller configured to adjust the OCV-factor and the CT-factor by comparing a previous predicted SoC, to a new predicted SoC established during a start-up condition from a predetermined battery performance array that correlates a new detected OCV with one or more of a battery SoC, cell voltage, cell internal resistance, temperature, and cumulative charge-discharge cycles.

9. A vehicle, comprising:
a controller configured to:
adjust a state-of-charge (SoC) of a battery coupled to a voltage-current sensor, and in response to a power signal:
detect by the sensor an open circuit voltage (OCV), current, differentiated current (DFC), and near zero current (NZC), and
adjust the SoC according to the OCV, DFC, and NZC being calibrated according to respective magnitudes and with NCFs.

10. The vehicle according to claim 9, further comprising:
the controller further configured to:
compare the OCV to a predetermined battery performance array that correlates the OCV magnitude with one or more of a battery SoC, cell voltage, cell internal resistance, temperature, and cumulative charge-discharge cycles; and
predict the SoC from a combination including the calibrated OCV determined according to the correlated performance array, and to exclude noise by the NCFs.

11. The vehicle according to claim 9, further comprising:
the controller further configured to:
generate the predicted SoC from a combination that includes the sum of an initial SoC and an integrated current per time calibrated according to the NCFs.

12. The vehicle according to claim 9, further comprising:
a switching contactor coupled to the voltage-current sensor and battery, configured to detect and communicate the OCV when the power signal establishes at least one of: (a) a vehicle start-up condition and when the switching contactor is open, and (b) a constant non-zero current, and (c) a constant zero current.

13. The vehicle according to claim 9, further comprising:
the controller configured to generate:
a SoC for the OCV and an SoC for the current per time (CT), and to calibrate the OCV-SoC with an OCV-factor and the CT-SoC with a CT-factor such that the factors: (a) are selected from the NCFs, (b) sum to 100 percent, and (c) are adjusted according to the magnitudes of the current, DFC, and NZC, and
the predicted SoC from a combined and calibrated OCV-SoC and CT-SoC.

14. The vehicle according to claim 13, further comprising:
the controller configured to generate the OCV-factor to be 100% and the CT-factor to be zero when the power signal identifies at least one of: (a) a vehicle startup condition, (b) a constant non-zero current, and (c) a constant zero current, such that the predicted SoC for the battery is established by the calibrated OCV.

15. The vehicle according to claim 13, further comprising:
the controller configured to generate the OCV-factor and the CT-factor to each be less than 100% and non-zero, when the power signal identifies a non-startup, vehicle operating condition, such that the predicted SoC for the battery is established by a sum of the calibrated OCV-SoC and CT-SoC.

16. The vehicle according to claim 13, further comprising:
the controller configured to adjust the OCV-factor and the CT-factor by comparing a previous predicted SoC, to a new predicted SoC established during a start-up condition from a predetermined battery performance array that correlates a new detected OCV with one or more of a battery SoC, cell voltage, cell internal resistance, temperature, and cumulative charge-discharge cycles.

17. A method of controlling a vehicle, comprising:
in response to a power signal,
detecting by a controller coupled to a battery, an open circuit voltage (OCV), current, differentiated current (DFC), and near zero current (NZC),
generating by the controller a predicted state of charge (SoC) from the OCV, DFC, and NZC calibrated according to respective magnitudes and with NCFs, and
adjusting a SoC of the battery according to the predicted SoC.

18. The method of controlling a vehicle according to claim 17, further comprising:
by the controller:
comparing the OCV to a predetermined battery performance array that correlates the OCV magnitude with one or more of a battery SoC, cell voltage, cell internal resistance, temperature, and cumulative charge-discharge cycles; and
predicting the SoC from a combination including the calibrated OCV determined according to the correlated performance array, and to exclude noise by the NCFs.

19. The method of controlling a vehicle according to claim 17, further comprising:
generating by the controller:
a SoC for the OCV and an SoC for current per time (CT), and to calibrate the OCV-SoC with an OCV-factor and the CT-SoC with a CT-factor such that the factors: (a) are selected from the NCFs, (b) sum to 100 percent, and (c) are adjusted according to the magnitudes of the current, DFC, and NZC, and
the predicted SoC from the combined and calibrated OCV-SoC and CT-SoC.

20. The method of controlling a vehicle according to claim 19, further comprising:
generating by the controller the OCV-factor to be 100% and the CT-factor to be zero when the power signal identifies at least one of a vehicle startup condition, a constant non-zero current, and a constant zero current, such that the predicted SoC for the battery is established by the calibrated OCV.

21. The method of controlling a vehicle according to claim 19, further comprising:
generating by the controller the OCV-factor and the CT-factor to each be less than 100% and non-zero, when the power signal identifies a non-startup, vehicle operating condition, such that the predicted SoC for the battery is established by the sum of the calibrated OCV-SoC and CT-SoC.

22. The method of controlling a vehicle according to claim 19, further comprising:
adjusting by the controller, the OCV-factor and the CT-factor by comparing a previous predicted SoC to a new predicted SoC established during a start-up condition from a predetermined battery performance array that correlates a new detected OCV with one or more of a battery SoC, cell voltage, cell internal resistance, temperature, and cumulative charge-discharge cycles.

\* \* \* \* \*